(12) United States Patent
Berk et al.

(10) Patent No.: US 11,611,195 B2
(45) Date of Patent: Mar. 21, 2023

(54) FABRICATION OF LOW-COST LONG WAVELENGTH VCSEL WITH OPTICAL CONFINEMENT CONTROL

(71) Applicant: Mellanox Technologies, Ltd., Yokneam (IL)

(72) Inventors: Yuri Berk, Kiryat Tivon (IL); Vladimir Iakovlev, Ecublens (CH); Tamir Sharkaz, Kfar Tavor (IL); Elad Mentovich, Tel Aviv (IL); Matan Galanty, Korazim (IL); Itshak Kalifa, Bat Yam (IL)

(73) Assignee: Mellanox Technologies, Ltd., Yokneam (IL)

( * ) Notice: Subject to any disclaimer, the term of this patent is extended or adjusted under 35 U.S.C. 154(b) by 157 days.

(21) Appl. No.: 17/138,623

(22) Filed: Dec. 30, 2020

(65) Prior Publication Data
US 2022/0209503 A1 Jun. 30, 2022

(51) Int. Cl.
*H01S 5/00* (2006.01)
*H01S 5/183* (2006.01)
(Continued)

(52) U.S. Cl.
CPC ...... *H01S 5/18316* (2013.01); *H01S 5/04252* (2019.08); *H01S 5/125* (2013.01);
(Continued)

(58) Field of Classification Search
CPC ............. H01S 5/18316; H01S 5/18369; H01S 5/18377; H01S 5/1838; H01S 5/209;
(Continued)

(56) References Cited

U.S. PATENT DOCUMENTS

| 5,985,686 A | * | 11/1999 | Jayaraman | .......... H01S 5/18391 |
| | | | | 372/45.01 |
| 10,396,527 B2 | | 8/2019 | Sirbu et al. | |

(Continued)

FOREIGN PATENT DOCUMENTS

| WO | 9808278 A1 | 2/1998 |
| WO | 02075263 A1 | 9/2002 |

OTHER PUBLICATIONS

Combined Search and Examination Report for related United Kingdom Application No. GB2118891.7 dated May 19, 2022.
(Continued)

*Primary Examiner* — Kinam Park
(74) *Attorney, Agent, or Firm* — Moore & Van Allen PLLC; Michael M. McCraw

(57) ABSTRACT

Several VCSEL devices for long wavelength applications in wavelength range of 1200-1600 nm are described. These devices include an active region between a semiconductor DBR on a GaAs wafer and a dielectric DBR regrown on the active region. The active region includes multi-quantum layers (MQLs) confined between the active n-InP and p-InAlAs layers and a tunnel junction layer above the MQLs. The semiconductor DBR is fused to the bottom of the active region by a wafer bonding process. The design simplifies integrating the reflectors and the active region stack by having only one wafer bonding followed by regrowth of the other layers including the dielectric DBR. An air gap is fabricated either in an n-InP layer of the active region or in an air gap spacer layer on top of the semiconductor DBR. The air gap enhances optical confinement of the VCSEL. The air gap may also contain a grating.

29 Claims, 7 Drawing Sheets

(51) Int. Cl.
    *H01S 5/042*   (2006.01)
    *H01S 5/343*   (2006.01)
    *H01S 5/125*   (2006.01)
    *H01S 5/20*    (2006.01)
    *H01S 5/30*    (2006.01)

(52) U.S. Cl.
    CPC ........ *H01S 5/1838* (2013.01); *H01S 5/18369* (2013.01); *H01S 5/18377* (2013.01); *H01S 5/209* (2013.01); *H01S 5/3095* (2013.01); *H01S 5/34306* (2013.01)

(58) Field of Classification Search
    CPC .... H01S 5/3095; H01S 5/34306; H01S 5/125; H01S 5/04252
    See application file for complete search history.

(56) References Cited

U.S. PATENT DOCUMENTS

| | | | |
|---|---|---|---|
| 10,601,201 B1 * | 3/2020 | Sirbu | ............... H01S 5/0203 |
| 2002/0131464 A1 * | 9/2002 | Sirbu | ............... H01S 5/18308 372/45.01 |
| 2007/0133642 A1 * | 6/2007 | Park | ............... H01S 5/02257 372/50.21 |
| 2018/0366905 A1 * | 12/2018 | Sirbu | ............... H01S 5/2081 |

OTHER PUBLICATIONS

"InP BTJ VCSEL Device Concept", [retrieved from Internet], <URL:https://www.vertilas.com/content/inp-btj-vcsel-device-concept>, 2014.

Alexei Sirbu et al., "Reliability of 1310 nm Wafer Fused VCSELs", IEEE Photonics Technology Letters, vol. 25, (16), pp. 1555-1558, (Aug. 25, 2013).

C. M. Long et al., "Polarization mode control of long-wavelength VCSELs by intracavity patterning" Optics Express, vol. 24, No. 9, Apr. 26, 2016.

Milton, Feng, et al., "Oxide-Confined VCSELs for High-Speed Optical Interconnects", IEEE Journal of Quantum Electronics ( vol. 54 , Issue: 3 , (Jun. 2018 ).

V. Iakovlev et al., "Wafer-fused heterostructures: application to vertical cavity surface-emitting lasers emitting in the 1310 nm band", Semicond. Sci. Technol.26, 014016 (2011).

U.S. Appl. No. 16/841,824 "Vertical-Cavity Surface-Emitting Laser Fabrication On Large Wafer" dated Apr. 7, 2020.

V. Iakovlev et al., "Progresses and challenges in industrial fabrication of wafer-fused VCSELs emitting in the 1310 nm band for high speed wavelength division multiplexing applications," Proc. SPIE 8639, 863904, (2013).

* cited by examiner

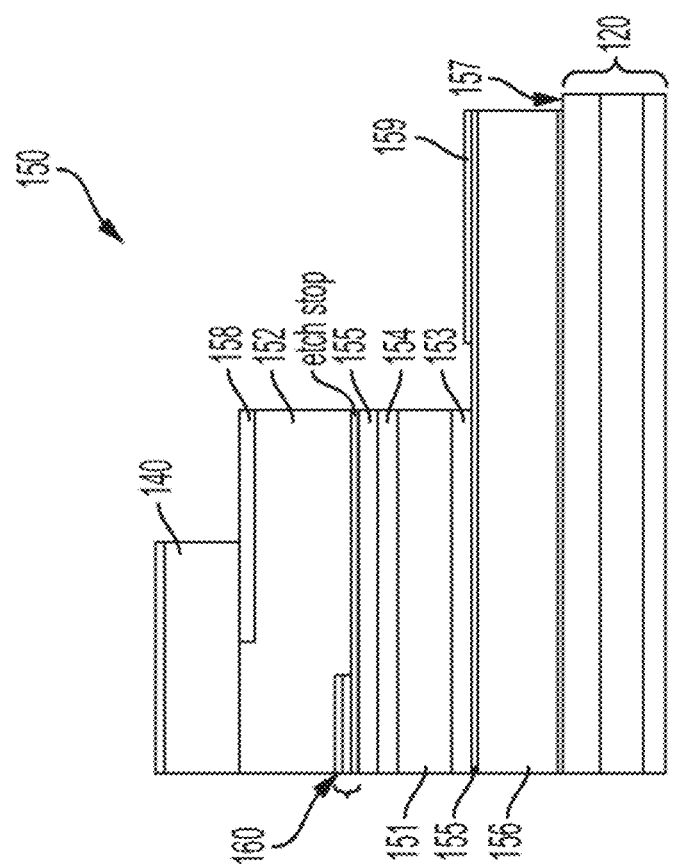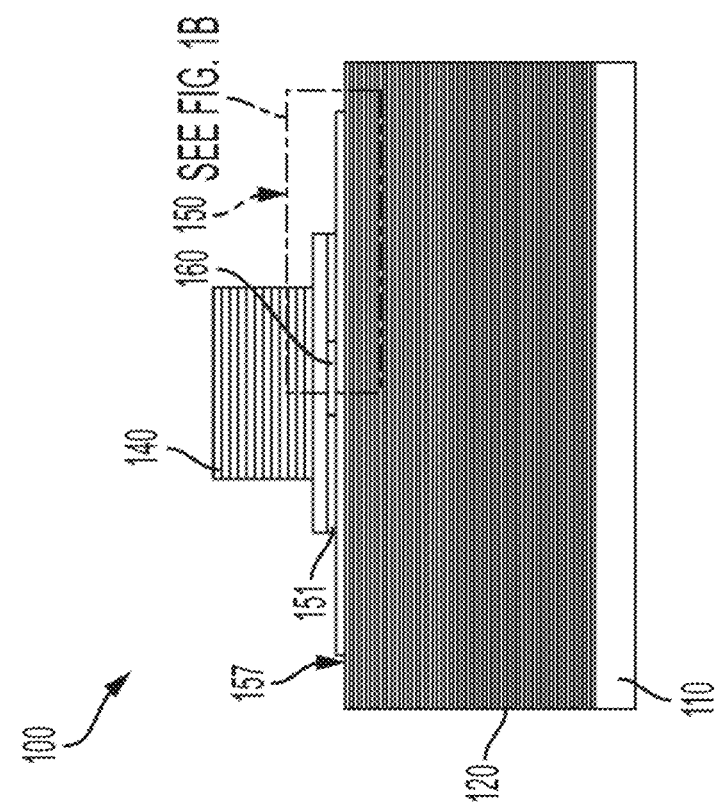

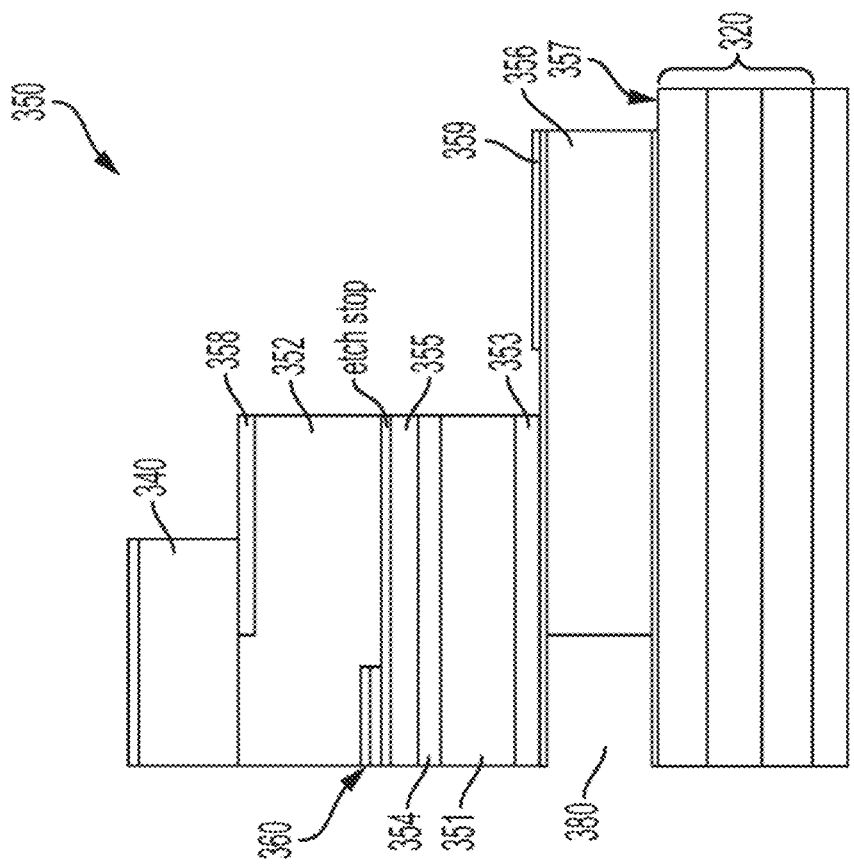
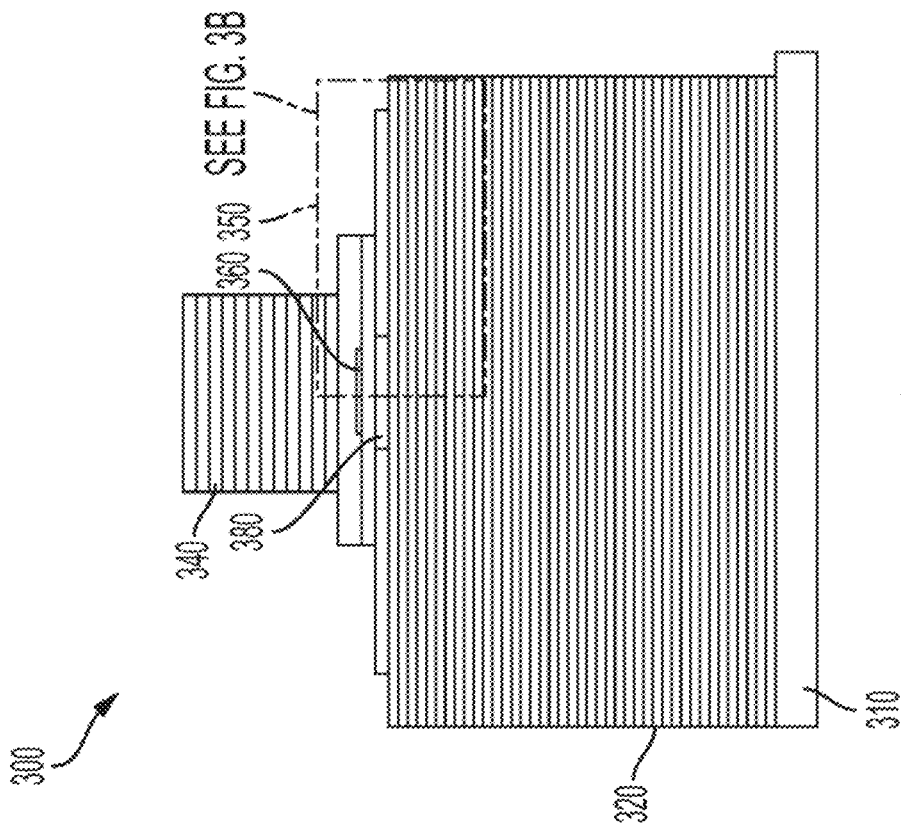
FIG. 3B
FIG. 3A

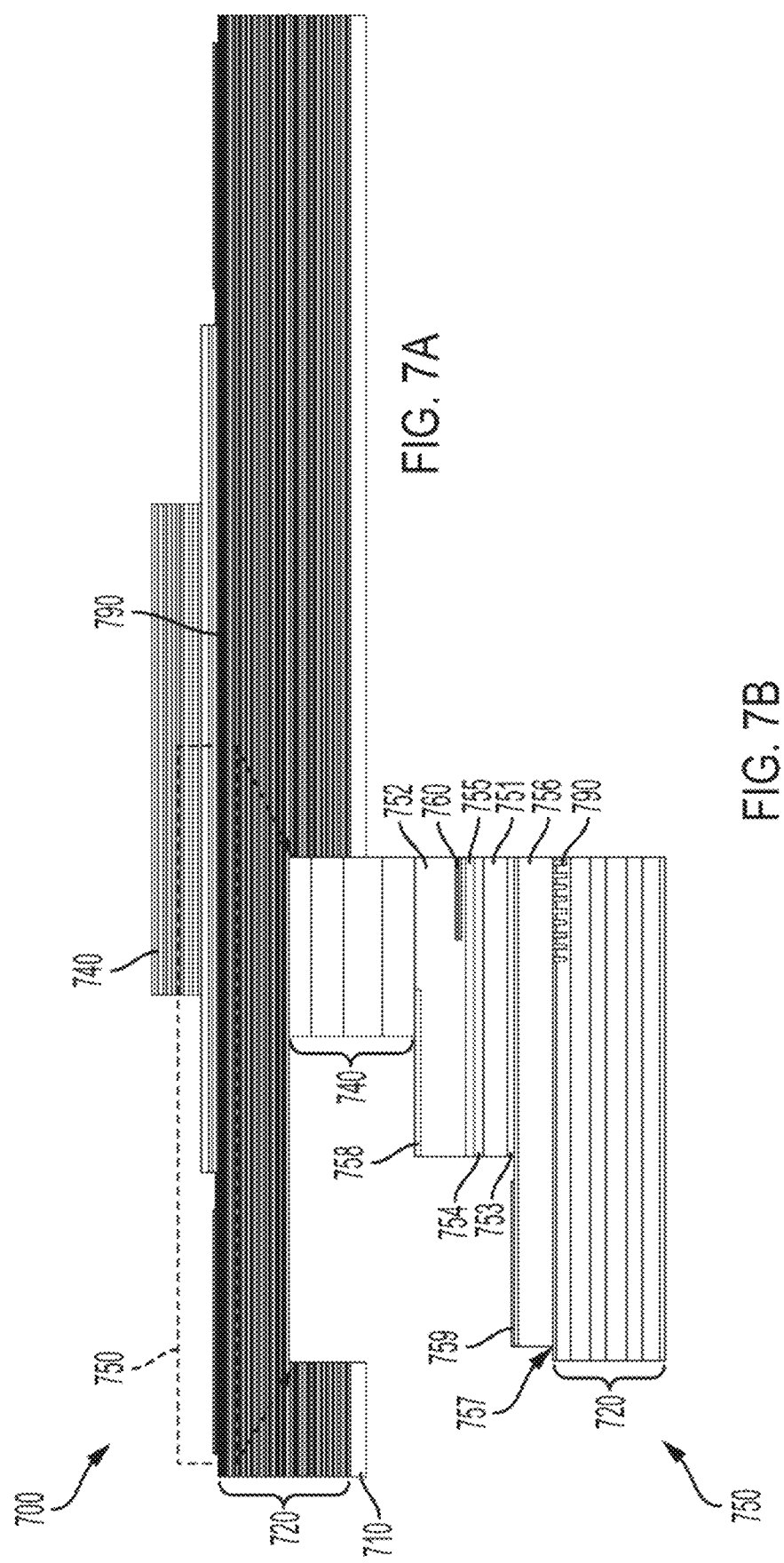

FABRICATION OF LOW-COST LONG WAVELENGTH VCSEL WITH OPTICAL CONFINEMENT CONTROL

TECHNICAL FIELD

Embodiments described herein relate to lasers for fiber-optic data and analog transmission, and more particularly, for design and fabrication of long wavelength VCSELs with optical confinement.

BACKGROUND

The use of vertical-cavity surface-emitting lasers (VCSELs) for optical transmission in fiber optic systems has provided several advantages over commonly used edge-emitting lasers. For example, VCSELs require less power consumption and can be manufactured more efficiently than edge-emitting lasers. One aspect of this efficiency is provided by the on-wafer testing capability of VCSELs. The ability to conduct on-wafer testing results in a considerable cost advantage compared with conventional testing techniques used for edge emitting lasers. Furthermore, VCSELs provide reliable operation over time, which is essential for applications in fiber optic systems.

Although design and fabrication of reliable short wavelength VCSELs by processing of epitaxial structures grown on gallium arsenide (GaAs) substrates are well developed and accepted by mass production industry, design and fabrication of long wavelength (LW) VCSELs within the wavelength range of 1200-1650 nm have not yet reached the same level of maturity, both from a performance and reliability perspective and from a cost per VCSEL chip point of view.

The most advanced designs for an active region for long wavelength include indium-phosphide (InP) based multi-quantum layers (MQLs) structures, buried Tunnel Junction (TJ) for lateral current and optical confinement, and intra-cavity contact schemes. Among all the known designs and fabrication approaches for LW VCSELs, only those VCSEL designs that have wafer fused GaAs based distributed Bragg reflectors (DBRs) and InP based active region have been reported showing credible reliable operation.

Wafer fused design and fabrication approaches have the advantage of providing the best possible heat sink from MQLs of active region, and this thermal management is of a paramount importance for reliable operation. The long wavelength VCSEL fabrication process out of double fused structure is very similar to that of the short wavelength VCSEL.

However, among several disadvantages of wafer fused designs, the most significant ones are: (i) the sacrifice of one InP and one GaAs substrates; (ii) the higher cost of epitaxial growth of semiconductor distributed Bragg reflector DBR layers as compared to DBRs formed of dielectric materials; and (iii) high sensitivity of the bonding process to surface morphology of the epi grown wafers. The essential difficulty in acquiring acceptable morphology for bonding is at regrowth of InP on patterned TJ, which forms a nonplanar wafer surface.

Last but not least, wafer fusion at high temperature introduces dimension scaling of the patterns on InP wafer after it bonds to GaAs, because different wafer materials may have mismatched thermal expansion coefficients. The issue of dimension scaling can be avoided if patterns on InP wafer part will match to patterns on the GaAs wafer after bonding.

Dielectric DBRs have been used in alternative designs and fabrication approaches. In its most advanced applications, a VCSEL fabricated with dielectric DBRs contains a very small amount of semiconductor material sandwiched by two dielectric DBRs on two thick metal layers respectively. The potentially low-cost design and fabrication processes of such VCSELs have the advantage of using dielectric DBRs with high index contrast. However, the fabrication process of such designs is much less mature and less reliable for both short wavelength and long wavelength VCSELs using double fused wafer structures. So far, this type of heterogeneous integration of semiconductors with dielectrics and metal materials is not well accepted by industry for large scale VCSEL fabrication.

For making VCSELs with dielectric DBRs at both sides, the main design limitation is the inherent high thermal resistance, because the MQLs locating in the region of optical and current confinement are sandwiched from both sides by thermally low conductive dielectric DBRs. Further optimization of the VCSEL structure with double sided DBRs often involves integrating metal host materials (usually gold). This results in increased manufacturing cost and decreased reliability of the VCSEL after packaging at subassembly system level.

In today's market, there is a huge demand for numerous applications of LW VCSELs with solutions for design and fabrication processes, comparable with the standard short wavelength VCSEL technology in metrics of performance, reliability, and cost.

Therefore, there is a need to find innovative LW VCSEL designs and a workable fabrication process for increased performance and reliability of single-mode and multi-mode LW VCSEL devices at affordable cost.

BRIEF SUMMARY

An exemplary embodiment of a vertical-cavity surface-emitting laser (VCSEL) includes the following elements: a first substrate; a first reflector disposed on the first substrate, wherein the first reflector comprises a distributed Bragg reflector (DBR) including multiple layers of alternating semiconductor materials; a second reflector, wherein the second reflector comprises a distributed Bragg reflector (DBR) including multiple alternating dielectric layers; and an active region structure disposed between the first reflector and the second reflector.

The bottom of the active region and a top of the first reflector form a fused interface layer via a wafer bonding process.

The active region structure comprises: a Multi-Quantum well and/or quantum dots Layers of VCSEL gain media (MQLs), wherein the MQLs are disposed between a first set of active semiconductor layers at a bottom side facing the first reflector and a second set of active semiconductor layers at a top side facing the second reflector; wherein the first set of active semiconductor layers comprises a first semiconductor layer disposed in direct contact with the MQLs and a second semiconductor layer disposed away from the MQLs; wherein a first etch stop layer is disposed between the first and the second semiconductor layer to define a patterning process to the active region structure for providing a space for a cathode layer; and wherein the second set of active semiconductor layers at a top side of the MQLs comprises a third semiconductor layer disposed in direct contact with the MQLs, a fourth semiconductor layer disposed over the third semiconductor layer away from the MQLs; a tunnel junction layer disposed over the fourth semiconductor layer and patterned to overlap a portion of the MQLs, wherein a second etch stop layer is disposed between the fourth semiconductor layer and the tunnel junction layer to define a patterning process for the tunnel junction layer; and a fifth semiconductor layer over the tunnel junction layer and the second etch stop layer; wherein the second reflector is fabricated on the fifth semiconductor layer, and wherein an anode layer is disposed on the fifth semiconductor layer next to the second reflector.

In some cases, the VCSEL is configured to emit a laser light within a wavelength range from 1200 nanometers (nm) to 1650 nm.

In some cases, the multiple layers of alternating semiconductor materials in the first reflector comprise layers of un-doped aluminum gallium arsenide (AlGaAs) and gallium arsenide (GaAs).

In some cases, the multiple alternating dielectric layers in the second reflector comprise alternating silicon and silicon oxide layer pairs arranged at a period of a quarter of the wavelength of the laser light.

In some cases, the first semiconductor layer and the second semiconductor layer are both n-doped indium phosphide (n-InP) layers.

In some cases, the third semiconductor layer and the fifth semiconductor layer are both n-doped indium phosphide (n-InP) layers, and wherein the fourth semiconductor layer is p-doped indium aluminum arsenate (p-InAlAs) layer.

In some cases, the tunnel junction layer comprises n++-doped InGaAlAs and p++-doped InGaAlAs.

In some cases, the first substrate is a GaAs wafer.

In some cases, the VCSEL further comprises: a cathode pad arranged on the first reflector, wherein the cathode pad comprises a cathode dielectric DBR stack, a polymer layer on the cathode dielectric DBR stack, and a metal cathode electrode on the polymer layer, wherein the metal cathode electrode connects to the cathode layer; and an anode pad arranged on the first reflector, wherein the anode pad comprises an anode dielectric DBR stack, a polymer layer on the anode dielectric DBR stack, and a metal anode electrode on the polymer layer, wherein the metal anode electrode connects to the anode layer.

Another exemplary embodiment of a VCSEL comprises: a first substrate; a first reflector disposed on the first substrate, wherein the first reflector comprises a distributed Bragg reflector (DBR) including multiple layers of alternating first semiconductor and second semiconductor materials; a second reflector, wherein the second reflector comprises a distributed Bragg reflector (DBR) including multiple alternating dielectric layers; an active region structure disposed between the first reflector and the second reflector.

The VCSEL further includes an air gap spacer layer, which contains an airgap and an air gap etch stop layer formed on the first reflector, wherein the air gap spacer layer comprises the first semiconductor material and the air gap etch stop layer comprises the second semiconductor material.

The bottom of the active region and the top of the air gap spacer layer form a fused interface layer via a wafer bonding process.

Further, the active region structure comprises: MQLs, wherein the MQLs are disposed between a first set of active semiconductor layers at a bottom side facing the first reflector and a second set of active semiconductor layers at a top side facing the second reflector.

The first set of active semiconductor layers comprises a first semiconductor layer disposed in direct contact with the MQLs and a second semiconductor layer disposed away from the MQLs; wherein a first etch stop layer is disposed between the first and the second semiconductor layer to define a patterning process to the active region structure for providing a space for a cathode layer.

The second set of active semiconductor layers at a top side of the MQLs comprises a third semiconductor layer disposed in direct contact with the MQLs, a fourth semiconductor layer disposed over the third semiconductor layer away from the MQLs.

A tunnel junction layer disposed over the fourth semiconductor layer and patterned to overlap a portion of the MQLs, wherein a second etch stop layer is disposed between the fourth semiconductor layer and the tunnel junction layer to define a patterning process for the tunnel junction layer; and a fifth semiconductor layer over the tunnel junction layer and the second etch stop layer; wherein the second reflector is fabricated on the fifth semiconductor layer, and wherein an anode layer is disposed on the fifth semiconductor layer next to the second reflector.

Another exemplary embodiment of a VCSEL comprises: a first substrate; a first reflector disposed on the first substrate, wherein the first reflector comprises a distributed Bragg reflector (DBR) including multiple layers of alternating first semiconductor and second semiconductor materials; a second reflector, wherein the second reflector comprises a distributed Bragg reflector (DBR) including multiple alternating dielectric layers; an active region structure disposed between the first reflector and the second reflector.

The bottom of the active region and the top of the first reflector form a fused interface layer via a wafer bonding process.

Further, the active region structure comprises: MQLs disposed between a first set of active semiconductor layers at a bottom side facing the first reflector and a second set of active semiconductor layers at a top side facing the second reflector; wherein the first set of active semiconductor layers comprises a first semiconductor layer disposed in direct contact with the MQLs and a second semiconductor layer disposed away from the MQLs.

An air gap is formed in the second semiconductor layer above the fused interface layer; a first etch stop layer is disposed between the first and the second semiconductor layer to define a patterning process of the active region structure for providing a space for a cathode layer; and the second set of active semiconductor layers at the top side of the MQLs comprises a third semiconductor layer disposed in direct contact with the MQLs, a fourth semiconductor layer disposed over the third semiconductor layer away from the MQLs.

A tunnel junction layer is disposed over the fourth semiconductor layer and patterned to overlap a portion of the MQLs, wherein a second etch stop layer is disposed between the fourth semiconductor layer and the tunnel junction layer to define a patterning process for the tunnel junction layer; and a fifth semiconductor layer over the tunnel junction layer and the second etch stop layer.

The second reflector is fabricated on the fifth semiconductor layer, and an anode layer is disposed on the fifth semiconductor layer next to the second reflector.

Further, the air gap includes a grating structure, wherein the grating structure is aligned to the tunnel junction and is characterized to enhanced optical confinement of the VCSEL laser.

BRIEF DESCRIPTION OF THE DRAWINGS

Having thus described the invention in general terms, reference will now be made to the accompanying drawings, which are not necessarily drawn to scale.

Figure 2B:
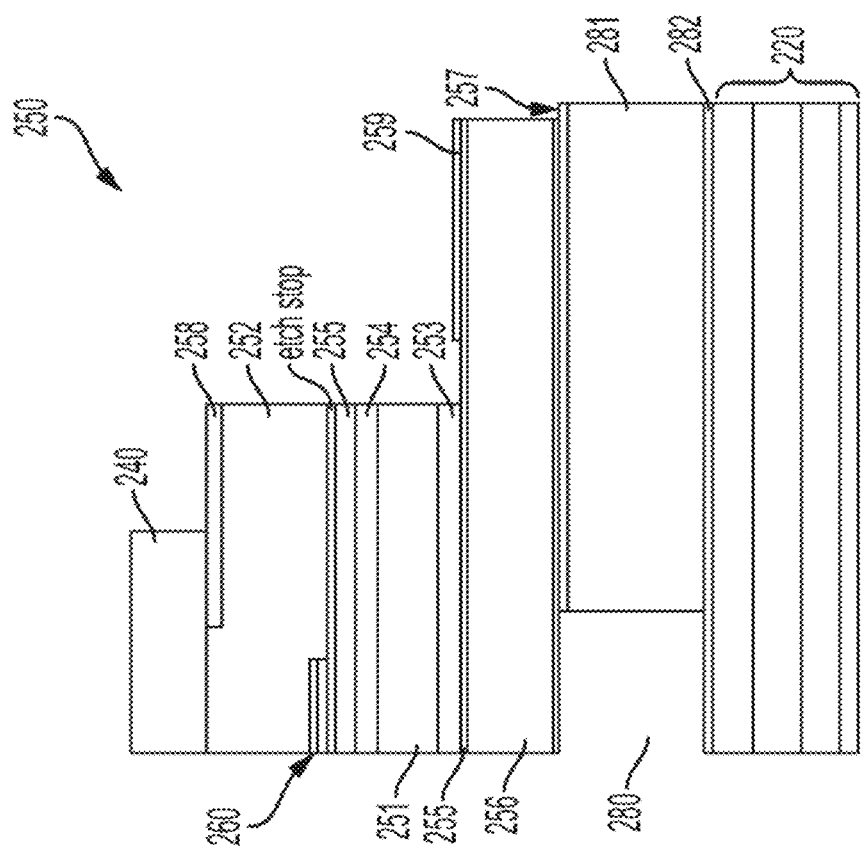
Figure 2A:
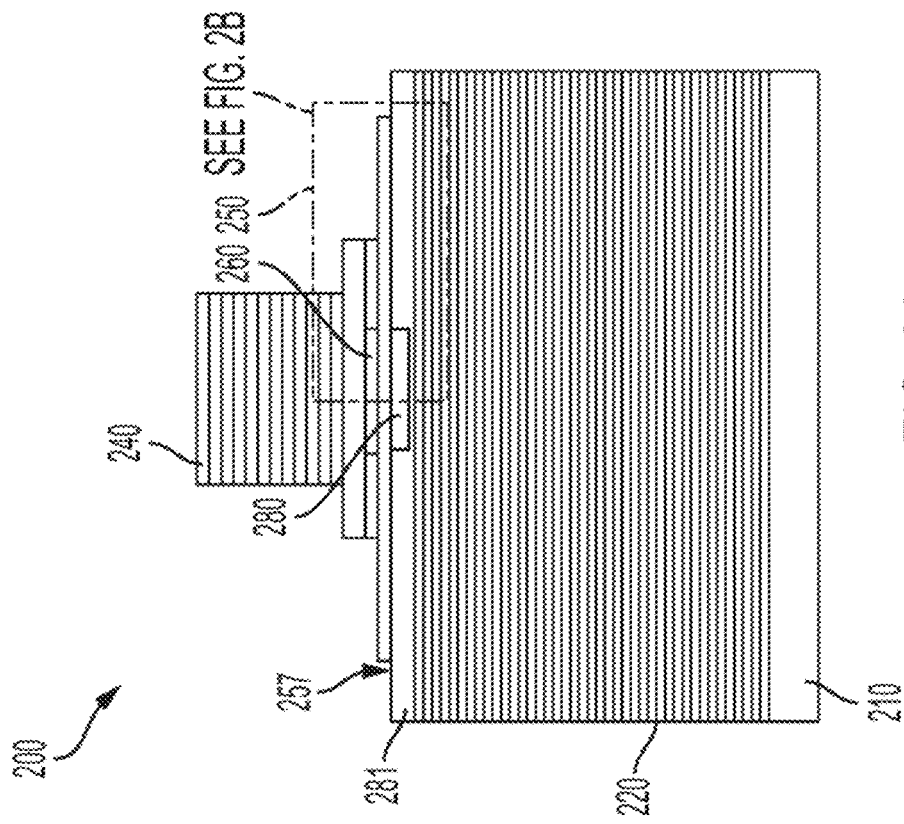
Figure 4:
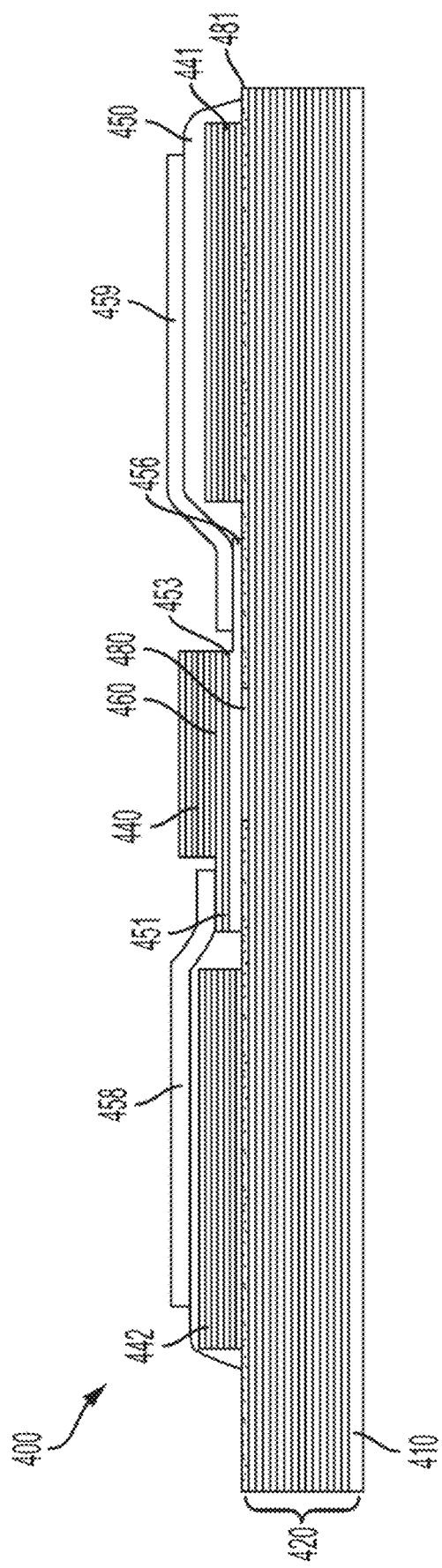
Figure 5:
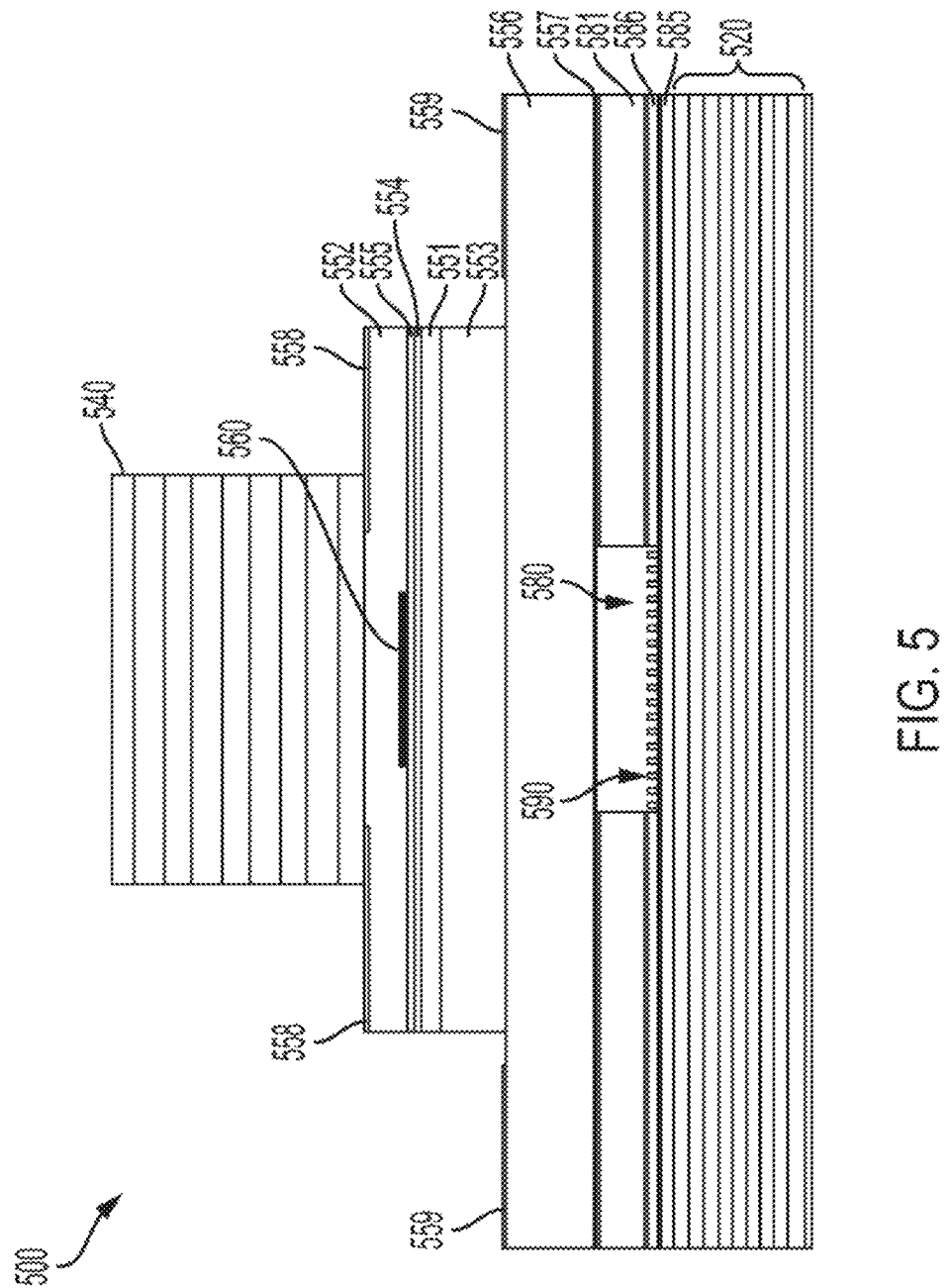
Figure 6:
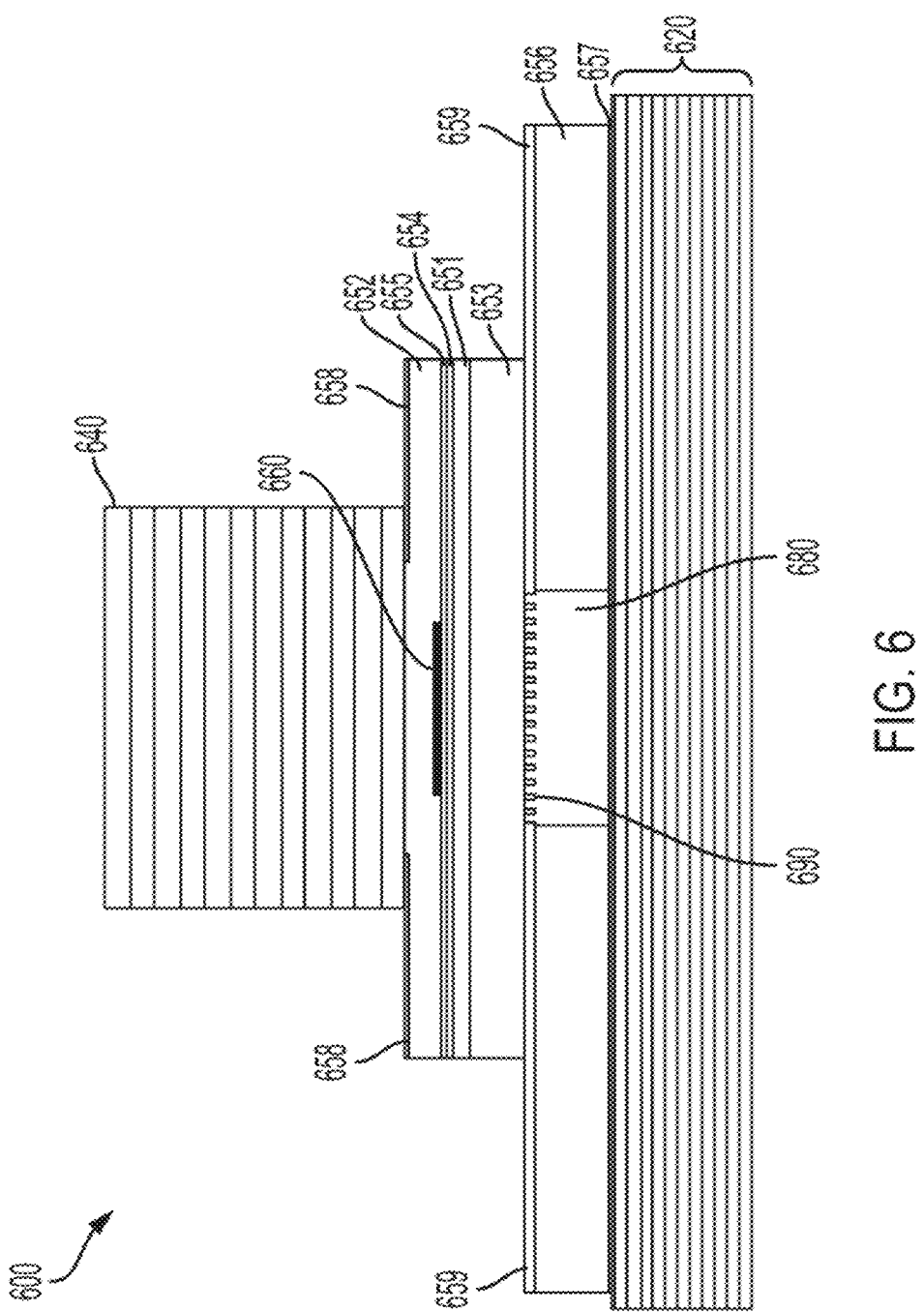

FIGS. 1A and 1B show a schematic cross-sectional diagram of the general design of a vertical-cavity surface-emitting laser (VCSEL), according to the present disclosure;

FIGS. 2A and 2B illustrate a schematic cross-sectional view of a VCSEL device including an air gap in the GaAs part of the structure, according to an exemplary embodiment of the present disclosure;

FIGS. 3A and 3B illustrate a schematic cross-sectional view of a VCSEL device including an air gap in the InP part of the structure, according to an exemplary embodiment of the present disclosure;

FIG. 4 illustrates a schematic cross-sectional view of a VCSEL device including dielectric layers in the top DBR as part of the contact pads, according to an exemplary embodiment of the present disclosure;

FIG. 5 illustrates a schematic cross-sectional view of a VCSEL device having gratings on the bottom of air gap formed on top of bottom GaAs DBR, according to an exemplary embodiment of the present disclosure;

FIG. 6 illustrates a schematic cross-sectional view of a VCSEL device having gratings on the InP based side of the air gap, according to an exemplary embodiment of the present disclosure; and FIGS. 7A and 7B illustrate a schematic cross-sectional view of a VCSEL device having gratings disposed on a fused interface, according to other embodiments of the present disclosure.

DETAILED DESCRIPTION OF THE INVENTION

The present invention now will be described more fully hereinafter with reference to the accompanying drawings, in which some, but not all embodiments of the invention are shown. Indeed, the invention may be embodied in many different forms and should not be construed as limited to the embodiments set forth herein; rather, these embodiments are provided so that this disclosure will satisfy applicable legal requirements. Like numbers refer to like elements throughout.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known processes and manufacturing techniques have not been described in particular detail in order to avoid unnecessarily obscuring the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the features, structures, configurations, or characteristics may be combined in any suitable manner in one or more embodiments. Similarly, the term "exemplary" is used to describe an example embodiment and does not indicate that the described embodiment is better than other embodiments unless stated otherwise.

The terms "over," "spanning," "to," "between," and "on" as used herein may refer to a relative position of one layer with respect to other layers. One layer "over," "spanning," or "on" another layer or bonded "to" or in "contact" with another layer may be directly in contact with the other layer or may have one or more intervening layers. One layer "between" layers may be directly in contact with the layers or may have one or more intervening layers.

The invention is proposing the ways and means to combine the best from the state of the art in LW VCSEL designs and fabrication for increasing performance and reliability of single-mode and multi-mode LW VCSEL devices at affordable cost.

The invention proposes to bond an InP based MQLs with a buried TJ active material to a GaAs based DBR bottom mirror reflector, which is usually a good heat sink, but for top output DBR reflector, the proposed method uses dielectric based materials instead of GaAs, with the benefits of (a) taking advantage of its potential low cost, (b) the dual use as a dielectric for contact pads, (c) the inherent potential to be deposited on a non-planar surface and with non-perfect morphology, in contrast with what is necessary currently in existing technology for wafer bonding, and (d) the increase of vertical intracavity optical confinement of VCSEL due to high contrast of refractive indexes of dielectric vs semiconductor GaAs based materials as DBR.

The invention also proposes to perform regrowth of TJ for lateral current and optical confinement in a sequence after the step of conducting a wafer bonding process that will get rid of dimension scaling.

In addition, the invention describes a way of implementing intra-cavity air gaps at the interface of InP based MQLs gain wafer and bottom mirror GaAs based DBR reflector for further increasing intracavity vertical optical confinement. The introduction of an air gap layer at a low refractive index value of 1.0 has the benefit of further decreasing the total number of the bottom GaAs DBR layers without compromising the vertical optical confinement of the VCSEL device. Designing the lateral geometry of an air gap and the fabrication process allows control of the single-mode and/or multi-mode lateral optical confinement and the laser beam polarization of the VCSEL devices.

In the fabrication process sequence, the invention proposes: (1) to pattern and process air gap(s) at either the InP-based active region or the GaAs bottom DBR wafer surface; (2) to apply only one single bonding of two wafers after (1); (3) to reverse the order of the wafer bonding and TJ regrowth as compared with first bonding in the existing scheme, such that the process involves: first transferring, to the bottom DBR on the GaAs substrate, the epi structure, which has the last layers being the TJ layers, then continuing with patterning and further regrowth n-InP upper electrical contact layer.

In this way, there are several advantages of having only one bonding process to combine the wafer with the dielectric materials deposited as the second (output) DBR reflector:

i. An air gap body is formed before the bonding process as a part of strong vertical and lateral VCSEL optical confinement;

ii. The solo-bonding is done on wafers with good planar morphology and low surface defect density before TJ patterning and regrowth of n-InP electrical contact that significantly increases yield of wafer bonding process;

iii. The problem of dimensional scaling is eliminated due to sequential patterning of TJ and regrowth after the bonding process;

iv. The requirements for regrowth morphology for deposition of dielectric material DBR layers are much more relaxed as compared to requirements for wafer bonding;

v. There are more degrees of freedom for engineering in the regrowth processes by metal oxide chemical vapor deposition (MOCVD) and/or molecular beam epitaxy (MBE) techniques, because of the relaxed requirements to regrowth surface morphology and tolerances;

vi. Dielectric layers in top DBR introduce a new degree of freedom to optimize the device design: locating p-contact closer to the current aperture to reduce series resistance, sharing the dielectric DBR layers as a contact pads and surface passivation, all the above increasing performance and reliability.

Embodiments of several proposed VCSEL devices are depicted in FIG. 1 to FIG. 7 according to disclosure of the current invention.

FIG. 1A shows a schematic cross-sectional diagram of a general design of a vertical-cavity surface-emitting laser (VCSEL), according to the present disclosure. FIG. 1B shows the detailed structure of the core part of the VCSEL device in FIG. 1A.

In general, the VCSEL device includes a lower wafer part and an upper regrown part. The lower wafer part will be bonded through a fusing process with the upper regrown part. The lower wafer part includes a semiconductor wafer and a bottom GaAs DBR. The semiconductor wafer can be a GaAs wafer or a GaAs slab of substrate. The upper regrown part includes active layers in an optical cavity and a dielectric based top DBR mirror instead of a semiconductor based top mirror. Additional features such as air gaps and gratings are introduced to enhance the optical confinement in the active cavity. The dielectric DBR layers may also be added in the electrical interconnect structures. Specific designs and structures will be disclosed in detail in the following figures FIG. 1 to FIG. 7.

In FIG. 1A, the VCSEL device 100 includes a bottom GaAs substrate 110, a bottom distributed Bragg reflector (DBR) containing gallium arsenide and aluminum gallium arsenide layers (GaAs/AlGaAs) 120 fabricated on the bottom substrate 110. A stack of core layers 150 including the MQLs 151 and tunnel junction (TJ) 160 is attached on top of the bottom DBR 120, the attaching interface 157 is fused between the bottom DBR 120 and the bottom of the stack 150. A top dielectric distributed Bragg reflector (DBR) 140 is attached to the top of the stack 150.

The core stack 150, shown in FIG. 1B, includes the MQLs 151. There is an intermediate n-InP (n doped InP) layer 153 below the MQLs 151 and another thicker n-InP layer 156 above the fused interface 157. The intermediate active n-InP layer 153 is patterned to give space to a cathode layer 159 fabricated on the thicker n-InP layer 156. An etch stop layer 155 may be formed on the lower n-InP layer 156 for proper patterning of the core stack 150.

Above the MQLs 151, the stack 150 further includes a layer of n-InP 154 formed on the MQLs 151, a p-InAlAs layer 155, and a TJ layer 160 patterned on the p-InAlAs layer 155. In some cases, there might be an etch stop layer i-InP on the p-InAlAs to better define the patterning. A thicker n-InP layer 152 is deposited on the TJ layer 160 as the electrical n-InP contact regrown layer on the active InP based structure and the p-InAlAs 155. Top dielectric DBR post 140 is deposited on top of the n-InP layer 152. A thin anode contact layer 158 is deposited on the n-InP layer 152 next to the top dielectric layer 140, in some cases, partially covered by layers of the top dielectric DBR 140 as an option. This will allow the diameter of the top DBR post 140 to be well above the diameter of the TJ 160.

FIG. 2A illustrates a schematic cross-sectional view of a VCSEL device including an air gap in the GaAs part of the structure, according to the second embodiment of the present disclosure. FIG. 2B shows the detailed structure of the core part of the VCSEL device in FIG. 2A. The second embodiment of the invention depicts the structure with a built-in air gap in the cavity.

In FIG. 2A, the VCSEL device 200 includes a bottom GaAs substrate 210, a bottom distributed Bragg reflector (DBR) containing gallium arsenide and aluminum gallium arsenide paired layers (GaAs/AlGaAs) 220 fabricated on the bottom substrate 210. There is a recess for an air gap 280 formed in the GaAs based part before bonding. For this purpose, the bottom DBR 220 has an additional GaAs layer that will serve as an air gap spacer 281 and an AlGaAs etch stop layer 282 on top of regular DBR structure 220 (as compared with the structure depicted in FIG. 1B).

A stack of core layers 250, including the MQLs 251 and the tunnel junction (TJ) 260, is attached on top of the air gap spacer layer 281 over the bottom DBR 220, and the interface 257 is fused between the air gap spacer layer 281 over the bottom DBR 220 and the bottom of the InP layer. A top dielectric distributed Bragg reflector (DBR) 240 is attached to the top of the stack 250.

The core stack 250, shown in FIG. 2B, includes the MQLs 251. There is an intermediate n-InP (n-doped InP) layer 253 below the MQLs 251 and another thicker n-InP layer 256 above the fused interface 257. The intermediate active n-InP layer 253 is patterned to give space to a cathode layer 259 fabricated on the thicker n-InP layer 256. An etch stop layer 255 may be formed on the lower n-InP layer 256 for proper patterning of the core stack 250.

Above the MQLs 251, the stack 250 further includes an active layer of n-InP 254 formed on the MQLs 251, a p-InAlAs layer 255, the TJ layer 260 patterned on the p-InAlAs layer 255, there might be an etch stop layer i-InP on the p-InAlAs layer 255 to better define the patterning. A thicker n-InP layer 252 is deposited on the TJ 260 as the electrical n-InP contact regrown layer on the active InP based structure and the p-InAlAs 255. The top dielectric DBR post 240 is deposited on top of the n-InP layer 252. A thin anode contact layer 258 is deposited on the n-InP layer 252 next to the top dielectric layer 240, in some cases, partially covered by layers of the top dielectric DBR 240 as an option. This will allow the diameter of the top DBR post 240 to be kept well above the diameter of TJ 260.

FIG. 3A illustrates a schematic cross-sectional view of a VCSEL device including an air gap in the InP part of the structure, according to an exemplary embodiment of the present disclosure. FIG. 3B shows the detailed structure of the core part of the VCSEL device in FIG. 3A. The third embodiment of the invention depicts the structure with a built-in air gap in the InP part of the cavity.

In FIG. 3A, the VCSEL device 300 includes a bottom GaAs substrate 310 and a bottom distributed Bragg reflector (DBR) containing gallium arsenide and aluminum gallium arsenide paired layers (GaAs/AlGaAs) 320 fabricated on the bottom substrate 310. There is a void for an air gap 380 formed in n-InP based part 356 before bonding to the GaAs/AlGaAs DBR 320 on the substrate 310. The bottom DBR 320 does not have the additional GaAs layer (as compared with the structure depicted in FIG. 2B).

A stack of core layers 350 including the MQLs 351 and tunnel junction (TJ) 360 is attached on top of the bottom DBR 320, and the attaching interface 357 is fused between the InP layer 356 where the air gap sits and the top of the bottom DBR 320. A top dielectric distributed Bragg reflector (DBR) 240 is attached to the top of the stack 250.

The core stack 350, shown in FIG. 3B, includes the MQLs 351. There is an intermediate active n-InP (n-doped InP) layer 353 below the MQLs 351 and the thicker n-InP layer 356 where the air gap resides above the fused interface 357. The intermediate active n-InP layer 353 is patterned to give space to a cathode layer 359 fabricated on the thicker n-InP layer 356. An etch stop layer may be formed on the lower n-InP layer 356 for proper patterning of the core stack 350.

Above the MQLs 351, the stack 350 further includes an active layer of n-InP 354 formed on the MQLs 351, a p-InAlAs layer 355, the TJ layer 360 patterned on the p-InAlAs layer 355, and, in some cases, there might be an etch stop layer i-InP on the p-InAlAs layer 355 to better define the patterning. A thicker n-InP layer 352 is deposited on the TJ 360 as the electrical n-InP contact regrown layer on the active InP based structure and the p-InAlAs 355. Top dielectric DBR post 340 is deposited on top of the n-InP layer 352. A thin anode contact layer 358 is deposited on the n-InP layer 352 next to the top dielectric layer 340, in some cases, partially covered by layers of the top dielectric DBR 340 as an option. This will allow the diameter of the top DBR post 340 to be kept well above the diameter of TJ 360. FIG. 3B shows also a picture of one possible arrangement in the embodiment proposing fabrication of the air gap 380 in the InP based structure before bonding. For persons skilled in the art, it will be understood in light of this disclosure that this is only one of several possible configurations.

FIG. 4 illustrates the schematic cross-sectional view of a VCSEL device including dielectric layers in the top DBR as part of the contact pads, according to an exemplary embodiment of the present disclosure.

In FIG. 4, the VCSEL device 400 includes a bottom GaAs substrate 410, a bottom distributed Bragg reflector (DBR) containing gallium arsenide and aluminum gallium arsenide paired layers (GaAs/AlGaAs) 420 fabricated on the bottom substrate 410. There is a recess for an air gap 480 formed in the GaAs based part. Similar to the device in FIG. 2A, the bottom DBR 420 has an additional GaAs layer that will serve as air gap spacer 481 on top of regular DBR structure 420. The MQLs 451 are sandwiched in between n-InP layers 456 below the MQL and 453 which is above the MQL. A TJ layer 460 is fabricated over the MQLs layer 451.

A top dielectric DBR 440 is fabricated on the n-InP layer over the TJ 460 as the top mirror for optical confinement. Two others dielectric DBRs 441 and 442 are fabricated as electrical contact pads. Top dielectric DBR 441 is built on the bottom GaAs/AlGaAs DBR 420 at one side of the active stack, to serve as the contact pad for a cathode layer 459. The DBR 442 is built on the bottom GaAs/AlGaAs DBR 420 at the other side of the active stack to serve as the contact pad for an anode layer 458. Both DBR 441 and 442 are covered by a polymer layer (for example BCB, a B-staged bisbenzocyclobutene). The cathode pad 441 is connected to an n-InP layer 456 below the MQLs 451, and the anode pad 442 is connected to an n-InP layer 453 above the MQLs 451. Metal electrodes, typically gold (Au), are applied as leads to connect to the contact pads 441 or 442.

The dielectric layers of the top DBR may form part of the contact pads for decreasing contact pad capacitance. This possibility can be applied for all configuration of air gaps.

FIG. 5 illustrates a schematic cross-sectional view of a VCSEL device having gratings on the bottom of an air gap formed on top of the bottom GaAs DBR, according to an exemplary embodiment of the present disclosure. In FIG. 5, the grating serves as an extra-cavity optical element for optical mode control on the bottom of air gap formed on top of the bottom GaAs DBR.

In FIG. 5, the VCSEL device 500 includes the lower wafer part and an upper regrown part. The lower wafer part will be bonded through a fusing process with the upper regrown part. The lower wafer part includes the semiconductor wafer, the bottom DBR and the grating in the air gap. The semiconductor wafer can be a GaAs wafer or a GaAs slab of substrate (not shown in FIG. 5), a bottom distributed Bragg reflector (DBR) containing gallium arsenide and aluminum gallium arsenide paired layers (GaAs/AlGaAs) 520 fabricated on the GaAs substrate. There is a recess for an air gap 580 formed in a GaAs layer on top of the DBR 520 before bonding this lower part to an active cavity. For this purpose, the bottom DBR 520 has an additional GaAs layer that will serve as an air gap spacer 581 and an AlGaAs etch stop layer 586 on top of the regular DBR structure 520 under the air gap spacer 581 (as compared with the structure depicted in FIG. 1B). A grating 590 is patterned with a lithography/etch process on the bottom surface of the air gap on top of bottom GaAs DBR 520 as an extra-cavity optical element for optical mode control. The grating 590 fabrication requires a high-resolution patterning as compared to patterning the air gap. Typically, e-beam or optical lithography can be applied to achieve the grating resolution required. Two etch stop layers 585 and 586 are included to define the two types of structures, as 586 is for stopping the etch of the air gap, and 585 is for stopping the etch of the grating features in the air gap 580.

The stack of layers over the semiconductor substrate, DBR, and air gap grating structures include the active optical cavity, the top mirror, and electrical interconnection. The active optical cavity includes the MQLs 551. There is an n-InP (n-doped InP) layer 553 below the MQLs 551 and another thicker n-InP layer 556.

A fusing layer 557 between the air gap spacer layer 581 and the thick n-InP layer is formed when the lower part is wafer-bonded to the upper active cavity. The intermediate active n-InP layer 553 is patterned to give space to a cathode layer 559 fabricated on the thicker n-InP layer 556.

The active cavity in the regrown layers also includes a layer of n-InP 554 formed on the MQLs 551, a p-InAlAs layer 555, a TJ layer 560 patterned on the p-InAlAs layer 555, and, in some cases, there might be an etch stop layer (not shown in FIG. 5) on the p-InAlAs layer 555 to better define the TJ 560's patterning. A thicker n-InP layer 552 is regrown by deposition on the TJ 560 as the electrical n-InP contact regrown layer on the active InP based structure and the p-InAlAs 555. The top dielectric DBR post 540 is deposited on top of the n-InP layer 552. A thin anode contact layer 558 is deposited on the n-InP layer 552 next to the top dielectric DBR layer 540, in some cases, partially covered by layers of the top dielectric DBR 540 as an option. This will allow the diameter of the top DBR post 540 to be kept well above the diameter of the TJ 560.

The dielectric DBR layer 540 is formed of a number of pairs of Si and SiOx layers. The difference in refraction indexes of Si and SiOx arranged at a period of a quarter of the wavelength of the long wave infrared light forms a high reflection surface as the top mirror of the optical cavity.

FIG. 6 illustrates a schematic cross-sectional view of a VCSEL device having gratings in the air gap in the InP layer, according to an exemplary embodiment of the present disclosure. Gratings serve as an intra-cavity optical element for mode control on the InP based side of the air gap.

In FIG. 6, the VCSEL device 600 includes a lower wafer part and an upper regrown part. The lower wafer part will be bonded through a fusing process with the upper regrown part. The lower wafer part includes the semiconductor wafer and the bottom DBR. The semiconductor wafer can be a GaAs wafer or a GaAs slab of substrate (not shown in FIG. 6) and a bottom distributed Bragg reflector (DBR) containing gallium arsenide and aluminum gallium arsenide paired layers (GaAs/AlGaAs) 620 fabricated on the GaAs substrate.

The stack of layers over the semiconductor substrate and the DBR includes the active optical cavity, the top mirror and electrical interconnection. The active optical cavity includes the MQLs 651, and an active n-InP (n-doped InP) layer 653 below the MQLs 651 and another thicker n-InP layer 656. A fusing layer 657 is disposed between the lower GaAs DBR 620 and thicker n-InP 656. A recess may be patterned and formed in the thicker n-InP layer 656 as the air gap 680 before bonding. The intermediate active n-InP layer 653 is patterned to give space to a cathode layer 659 fabricated on the thicker n-InP layer 656.

The active cavity in the regrown layers also includes a layer of n-InP 654 formed on the MQLs 651, a p-InAlAs layer 655, a TJ layer 660 patterned on the p-InAlAs layer 655, and, in some cases, there might be an etch stop layer (not shown in FIG. 6) on the p-InAlAs layer 655 to better define the TJ 660's patterning. A thicker n-InP layer 552 is regrown by deposition on the TJ 660 as the electrical n-InP contact regrown layer on the active InP based structure and the p-InAlAs 655. The top dielectric DBR post 640 is deposited on top of the n-InP layer 652. A thin anode contact layer 658 is deposited on the n-InP layer 652 next to the top dielectric layer 640, in some cases, partially covered by layers of the top dielectric DBR 640 as an option. This will allow the diameter of the top DBR post 640 to be kept well above the diameter of the TJ 660.

The dielectric DBR layer 640 is formed of a number of pairs of Si and SiOx layers. The difference in refraction indexes of Si and SiOx arranged at a period of a quarter of the wavelength of the long wave infrared light forms a high reflection surface as the top mirror of the optical cavity.

A grating 690 is patterned with a lithography/etch process on the top surface of the air gap in layer n-InP 656 as an intra-cavity optical element for optical mode control. The grating 690 fabrication requires a high-resolution patterning as compared to the patterning of the air gap. Typically, e-beam or optical lithography can be applied to achieve the grating resolution requirement. Etch stop layers for the air gap and the gratings may be needed to define the structures, although the etch stop layers are not shown in FIG. 6.

FIG. 7A illustrates a schematic cross-sectional view of a VCSEL device having gratings disposed on fused interface, according to other embodiments of the present disclosure. FIG. 7B shows the detailed structure of the core part of the VCSEL device in FIG. 7A. In FIGS. 7A and 7B, a grating is formed on the fused interface of the GaAs part of the structure.

In FIG. 7A, the VCSEL device 700 includes a bottom GaAs substrate 710, a bottom distributed Bragg reflector (DBR) containing gallium arsenide and aluminum gallium arsenide paired layers (GaAs/AlGaAs) 720 fabricated on the bottom substrate 710, a grating layer 790 at the fusing interface, a stack of core layers 750, and the top dielectric DBR 740.

The stack of core layers 750 comprises the MQLs 751 and a tunnel junction (TJ) 760, the interface 757 fused between the bottom DBR 720 and the bottom of the InP layer 756, and a top dielectric DBR 740.

Patterning of the grating structure 790 is done before bonding of the semiconductor wafer to the InP based active optical cavity. The grating process is performed in the top GaAs layer. The next AlGaAs layer on the DBR 720 may serve as an etch stop layer to define the depth of the grating etching.

The core stack 750, shown in FIG. 7B, includes the MQLs 751, an intermediate n-InP (n-doped InP) layer 753 below the MQLs 751 and a thicker n-InP layer 756 below the n-InP layer 753 and above the fused interface 757 where the gratings 790 are fabricated. The intermediate active n-InP layer 753 is patterned to give space to a cathode layer 759 fabricated on the thicker n-InP layer 756. An etch stop layer (not shown in FIG. 7B) may be formed on the lower n-InP layer 756 for proper patterning of the core stack 750.

Above the MQLs 751, the stack 750 further includes a layer of n-InP 754 formed on the MQLs 751, a p-InAlAs layer 755, a TJ layer 760 patterned on the p-InAlAs layer 755, and in some cases there might be an etch stop layer (not shown in FIG. 7B) on the p-InAlAs layer 755 to better define the patterning. A thicker n-InP layer 752 is deposited on the TJ 760 as the electrical n-InP contact regrown layer on the active InP based structure and the p-InAlAs 755. The top dielectric DBR post 740 is deposited on top of the n-InP layer 752. A thin anode contact layer 758 is deposited on the n-InP layer 752 next to the top dielectric layer 740, in some cases, partially covered by layers of the top dielectric DBR 740 as an option. This will allow the diameter of the top DBR post 740 to be kept well above the diameter of TJ 760.

Displacing the gratings 790 in the fusing layer 757 has the advantage of presenting the low thermal resistance in the structure with intra-cavity grating.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

In utilizing the various aspects of the embodiments, it would become apparent to one skilled in the art in light of this disclosure that combinations or variations of the above embodiments are possible for fabricating optical coupling structures. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

Which is claimed is:
1. A vertical-cavity surface-emitting laser (VCSEL) comprising:
   a first substrate;
      a first reflector disposed on the first substrate, wherein the first reflector comprises a distributed Bragg reflector (DBR) including multiple layers of alternating semiconductor materials;

a second reflector, wherein the second reflector comprises a distributed Bragg reflector (DBR) including multiple alternating dielectric layers; and
an active region structure disposed between the first reflector and the second reflector, wherein a bottom of the active region and a top of the first reflector form a fused interface layer via a wafer bonding process,
wherein the VCSEL is configured to emit a laser light within a wavelength range of 1200 nanometers (nm) to 1650 nm,
wherein the multiple alternating dielectric layers in the second reflector comprise alternating silicon and silicon oxide layer pairs arranged at a period of a quarter of the wavelength of the laser light.

2. The VCSEL of claim 1, wherein the active region structure comprises:
multi-quantum well layers (MQLs), wherein the MQLs are disposed between a first set of active semiconductor layers at a bottom side facing the first reflector and a second set of active semiconductor layers at a top side facing the second reflector;
wherein the first set of active semiconductor layers comprises a first semiconductor layer disposed in direct contact with the MQLs and a second semiconductor layer disposed away from the MQLs;
wherein a first etch stop layer is disposed between the first and the second semiconductor layer to define a space for a cathode layer; and
wherein the second set of active semiconductor layers at a top side of the MQLs comprises a third semiconductor layer disposed in direct contact with the MQLs, and a fourth semiconductor layer disposed over the third semiconductor layer away from the MQLs;
a tunnel junction layer disposed over the fourth semiconductor layer and patterned to overlap a portion of the MQLs, wherein a second etch stop layer is disposed between the fourth semiconductor layer and the tunnel junction layer to define the tunnel junction layer; and
a fifth semiconductor layer over the tunnel junction layer and the second etch stop layer;
wherein the second reflector is fabricated on the fifth semiconductor layer, and wherein an anode layer is disposed on the fifth semiconductor layer proximate to the second reflector.

3. The VCSEL of claim 1, and wherein the multiple layers of alternating semiconductor materials in the first reflector comprise layers of un-doped aluminum gallium arsenide (AlGaAs) and gallium arsenide (GaAs).

4. The VCSEL of claim 2, wherein the first semiconductor layer and the second semiconductor layer are both n-doped indium phosphide (n-InP) layers.

5. The VCSEL of claim 2, wherein the third semiconductor layer and the fifth semiconductor layer are both n-doped indium phosphide (n-InP) layers, and wherein the fourth semiconductor layer is p-doped indium aluminum arsenate (p-InAlAs) layer.

6. The VCSEL of claim 2, wherein the tunnel junction layer comprises n++-doped InGaAlAs and p++-doped InGaAlAs.

7. The VCSEL of claim 1, wherein the first substrate is a GaAs wafer.

8. The VCSEL of claim 2, further comprising:
a cathode pad arranged on the first reflector, wherein the cathode pad comprises a cathode dielectric DBR stack, a polymer layer on the cathode dielectric DBR stack, and a metal cathode electrode on the polymer layer, wherein the metal cathode electrode connects to the cathode layer electrically; and
an anode pad arranged on the first reflector, wherein the anode pad comprises an anode dielectric DBR stack, a polymer layer on the anode dielectric DBR stack, and a metal anode electrode on the polymer layer, wherein the metal anode electrode connects to the anode layer electrically.

9. A vertical-cavity surface-emitting laser (VCSEL) comprising:
a first substrate;
a first reflector disposed on the first substrate, wherein the first reflector comprises a distributed Bragg reflector (DBR) including multiple layers of alternating first semiconductor and second semiconductor materials;
a second reflector, wherein the second reflector comprises a distributed Bragg reflector (DBR) including multiple alternating dielectric layers;
an active region structure disposed between the first reflector and the second reflector; and
an air gap spacer layer containing an airgap and an air gap etch stop layer formed on the first reflector, wherein the air gap spacer layer comprises the first semiconductor material and the air gap etch stop layer comprises the second semiconductor material;
wherein a bottom of the active region and a top of the air gap spacer layer form a fused interface layer via a wafer bonding process.

10. The VCSEL of claim 9, wherein the active region structure comprises:
MQLs, wherein the MQLs are disposed between a first set of active semiconductor layers at a bottom side facing the first reflector and a second set of active semiconductor layers at a top side facing the second reflector;
wherein the first set of active semiconductor layers comprises a first semiconductor layer disposed in direct contact with the MQLs and a second semiconductor layer disposed away from the MQLs;
wherein a first etch stop layer is disposed between the first and the second semiconductor layer to define a space for a cathode layer; and
wherein the second set of active semiconductor layers at a top side of the MQLs comprises a third semiconductor layer disposed in direct contact with the MQLs, and a fourth semiconductor layer disposed over the third semiconductor layer away from the MQLs;
a tunnel junction layer disposed over the fourth semiconductor layer and patterned to overlap a portion of the MQLs, wherein a second etch stop layer is disposed between the fourth semiconductor layer and the tunnel junction layer to define the tunnel junction layer; and
a fifth semiconductor layer over the tunnel junction layer and the second etch stop layer;
wherein the second reflector is fabricated on the fifth semiconductor layer, and wherein an anode layer is disposed on the fifth semiconductor layer proximate to the second reflector.

11. The VCSEL of claim 9, wherein the VCSEL is configured to emit a laser light within a wavelength range of 1200 nanometers (nm) to 1650 nm.

12. The VCSEL of claim 9, and wherein the first semiconductor material in the first reflector comprises un-doped gallium arsenide (GaAs) and the second semiconductor material in the first reflector comprises un-doped aluminum gallium arsenide (AlGaAs).

13. The VCSEL of claim 10, wherein the multiple alternating dielectric layers in the second reflector comprise alternating silicon and silicon oxide layer pairs arranged at a period of a quarter of the wavelength of the laser light.

14. The VCSEL of claim 9, wherein the air gap includes a grating structure, wherein the grating structure is aligned to the tunnel junction and is characterized to enhanced optical confinement of the VCSEL laser.

15. The VCSEL of claim 10, wherein the first semiconductor layer and the second semiconductor layer in the active region structure are both n-doped indium phosphide (n-InP) layers.

16. The VC SEL of claim 9, wherein the third semiconductor layer and the fifth semiconductor layer are both n-doped indium phosphide (n-InP) layers, and wherein the fourth semiconductor layer is p-doped indium aluminum arsenate (p-InAlAs) layer.

17. The VCSEL of claim 9, wherein the tunnel junction layer comprises n++-doped InGaAlAs and p++-doped InGaAlAs.

18. The VCSEL of claim 9, wherein the first substrate is a GaAs wafer.

19. The VCSEL of claim 9, further comprising:
a cathode pad arranged on the first reflector, wherein the cathode pad comprises a cathode dielectric DBR stack, a polymer layer on the cathode dielectric DBR stack, and a metal cathode electrode on the polymer layer, wherein the metal cathode electrode connects to the cathode layer electrically; and
an anode pad arranged on the first reflector, wherein the anode pad comprises an anode dielectric DBR stack, a polymer layer on the anode dielectric DBR stack, and a metal anode electrode on the polymer layer, wherein the metal anode electrode connects to the anode layer electrically.

20. A vertical-cavity surface-emitting laser (VCSEL) comprising:
a first substrate;
a first reflector disposed on the first substrate, wherein the first reflector comprises a distributed Bragg reflector (DBR) including multiple layers of alternating first semiconductor and second semiconductor materials;
a second reflector, wherein the second reflector comprises a distributed Bragg reflector (DBR) including multiple alternating dielectric layers; and
an active region structure disposed between the first reflector and the second reflector;
wherein a bottom of the active region and a top of the first reflector form a fused interface layer via a wafer bonding process;
wherein the active region structure comprises:
MQLs, wherein the MQLs are disposed between a first set of active semiconductor layers at a bottom side facing the first reflector and a second set of active semiconductor layers at a top side facing the second reflector;
wherein the first set of active semiconductor layers comprises a first semiconductor layer disposed in direct contact with the MQLs and a second semiconductor layer disposed away from the MQLs;
wherein an air gap is formed in the second semiconductor layer above the fused interface layer;
wherein a first etch stop layer is disposed between the first and the second semiconductor layer to define a patterning process of the active region structure for providing a space for a cathode layer; and
wherein the second set of active semiconductor layers at the top side of the MQLs comprises a third semiconductor layer disposed in direct contact with the MQLs, and a fourth semiconductor layer disposed over the third semiconductor layer away from the MQLs;
a tunnel junction layer disposed over the fourth semiconductor layer and patterned to overlap a portion of the MQLs, wherein a second etch stop layer is disposed between the fourth semiconductor layer and the tunnel junction layer to define a patterning process for the tunnel junction layer; and
a fifth semiconductor layer over the tunnel junction layer and the second etch stop layer;
wherein the second reflector is fabricated on the fifth semiconductor layer, and wherein an anode layer is disposed on the fifth semiconductor layer next to the second reflector.

21. The VCSEL of claim 20, wherein the VCSEL is configured to emit a laser light within a wavelength range of 1200 nanometers (nm) to 1650 nm.

22. The VCSEL of claim 20, and wherein the first semiconductor material in the first reflector comprises un-doped gallium arsenide (GaAs) and the second semiconductor material in the first reflector comprises un-doped aluminum gallium arsenide (AlGaAs).

23. The VCSEL of claim 21, wherein the multiple alternating dielectric layers in the second reflector comprise alternating silicon and silicon oxide layer pairs arranged at a period of a quarter of the wavelength of the laser light.

24. The VCSEL of claim 20, wherein the air gap includes a grating structure, wherein the grating structure is aligned to the tunnel junction and is characterized to enhanced optical confinement of the VCSEL laser.

25. The VCSEL of claim 20, wherein the first semiconductor layer and the second semiconductor layer in the active region structure are both n-doped indium phosphide (n-InP) layers.

26. The VCSEL of claim 20, wherein the third semiconductor layer and the fifth semiconductor layer are both n-doped indium phosphide (n-InP) layers, and wherein the fourth semiconductor layer is p-doped indium aluminum arsenate (p-InAlAs) layer.

27. The VCSEL of claim 20, wherein the tunnel junction layer comprises n++-doped InGaAlAs and p++-doped InGaAlAs.

28. The VCSEL of claim 20, wherein the first substrate is a GaAs wafer.

29. The VCSEL of claim 20, further comprising:
a cathode pad arranged on the first reflector, wherein the cathode pad comprises a cathode dielectric DBR stack, a polymer layer on the cathode dielectric DBR stack, and a metal cathode electrode on the polymer layer, wherein the metal cathode electrode connects to the cathode layer electrically; and
an anode pad arranged on the first reflector, wherein the anode pad comprises an anode dielectric DBR stack, a polymer layer on the anode dielectric DBR stack, and a metal anode electrode on the polymer layer, wherein the metal anode electrode connects to the anode layer electrically.

* * * * *